United States Patent
Kwon et al.

[11] Patent Number: 6,130,568
[45] Date of Patent: Oct. 10, 2000

[54] THRESHOLD VOLTAGE COMPENSATION CIRCUIT

[75] Inventors: Oh-kyong Kwon, Seoul; Jin Jeon, Anyang, both of Rep. of Korea

[73] Assignee: Samsung Electronics Co., Ltd., Suwon, Rep. of Korea

[21] Appl. No.: 09/231,670

[22] Filed: Jan. 15, 1999

[30] Foreign Application Priority Data

Jan. 16, 1998 [KR] Rep. of Korea .......................... 98-1242

[51] Int. Cl.[7] ...................................................... H03L 5/00
[52] U.S. Cl. ............................................. 327/307; 327/362
[58] Field of Search .................................. 327/362, 363, 327/534, 537, 307, 390, 589

[56] References Cited

U.S. PATENT DOCUMENTS

| | | | |
|---|---|---|---|
| 3,806,741 | 4/1974 | Smith | 327/537 |
| 5,202,588 | 4/1993 | Matsuo et al. | 327/536 |
| 5,821,805 | 10/1998 | Jinbo | 327/537 |

*Primary Examiner*—Toan Tran
*Assistant Examiner*—Paul Dinh
*Attorney, Agent, or Firm*—Howrey Simon Arnold & White, LLP

[57] ABSTRACT

A circuit for compensating for the threshold voltage non-uniformity and variations includes a transistor having a threshold voltage, a first switching element for switching between the gate and drain electrodes of the transistor, a first capacitor of which first electrode is connected to the contact between the gate electrode of the transistor and the first switching element so as to recognize and store the threshold voltage of the transistor, a second switching element for switching between the second electrode of the first capacitor and the source electrode of the transistor, and a third switching element for switching the input voltage to the second electrode of the first capacitor.

12 Claims, 9 Drawing Sheets

# THRESHOLD VOLTAGE COMPENSATION CIRCUIT

BACKGROUND OF THE INVENTION (a) Field of the Invention

The present invention relates to a semiconductor circuit that uses an element having a threshold voltage, and more particularly to a circuit that compensates for the nonuniformity and variations of the threshold voltage.

(b) Description of the Related Art

Semiconductor devices having a threshold voltage, i.e., metal-oxide semiconductor (MOS) transistors, are most widely used. There are various kinds of transistors, for example, a single crystal silicon transistor, a thin film polycrystalline silicon transistor, an amorphous silicon transistor and the like.

Such MOS transistors have a threshold voltage between the gate and source electrodes that turns the device on or off. The threshold voltage is expressed by a thickness of a gate insulation film formed between the gate electrode and a channel area, and the degree of the doping in the channel area, which vary in accordance with the process condition.

The nonuniformity and variations of the threshold voltage may cause a significant error for the circuit operation.

As described above, the threshold voltage is an important factor for an operation of the circuitry. Therefore, an analog circuit employing a polycrystalline silicon transistor or an amorphous silicon transistor having significant nonuniformity or variations in the threshold voltage is hard to be realized.

A method for compensating for a nonuniformity or variations of the threshold voltage outside of the circuit is used when the circuit is made up of single silicon transistors. However, such a method is complicated and may not ensure a precise circuit operation.

FIG. 1 is a circuit view of a conventional common drain MOS transistor.

The conventional MOS transistor includes an n-channel MOS (NMOS) transistor 15 that consists of a gate electrode 12, a drain terminal 11, and a source terminal 13 and has a threshold voltage, and a capacitor 14 connected between the source terminal 13 and an earth terminal. A constant voltage $V_{DD}$ is supplied to the drain terminal 11.

The conventional transistor operates as follows.

If a voltage higher than a threshold voltage is applied to the gate electrode 12, the transistor 15 is turned on and a current flows from the drain terminal 11 toward the source terminal 13, which charges the capacitor 14 and raises the electric potential of the source terminal 13. When the electric potential reaches the difference between the input voltage of the gate electrode 12 and the threshold voltage of the transistor 15, the transistor 15 is turned off and the difference between the input voltage and the threshold voltage appears in the source terminal 13. In such a structure, if the threshold voltage is not uniform or varies, the output voltage varies corresponding to the variation of the threshold voltage. In other words, the nonuniformity and variations of the threshold voltage cause a distorted output.

FIG. 2 is a circuit view of the conventional transistor consisting of an n-channel MOS and a p-channel MOS.

Such a conventional transistor circuit includes the NMOS transistor 15 consisting of the gate electrode 12, the drain terminal 11, and the source terminal 13 and having a certain threshold voltage, a PMOS transistor 19 consisting of a gate electrode 18, a source terminal 16, a drain terminal 17 and having a certain threshold voltage, a first switching element 1 for switching between the gate electrode 12 of the NMOS transistor 15 and the earth terminal, a second switching element 2 for switching between the input terminal and the gate electrode 12, a third switching element 3 for switching between the source terminal 13 and the output terminal, a fourth switching element 4 for switching between the source terminal 16 and the output terminal, a fifth switching element 5 for switching between the gate electrode 18 and the input terminal, and a sixth switching element 6 for switching between the gate electrode 18 and the constant voltage $V_{DD}$ applied to the drain terminal 11 of the NMOS transistor 15.

In such a conventional circuitry consisting of the NMOS and PMOS transistors, the output voltage varies corresponding to the degree of the threshold voltage variation if the threshold voltage fluctuates or varies. That is, the threshold voltage fluctuation or variation causes a distorted output.

The conventional MOS transistors have following problems.

MOS transistors have threshold voltages which can vary in accordance with the process condition, substances and thickness of the gate insulation film, and the degree of the doping in the channel area. Therefore, the circuitry using such a MOS transistor may not function properly due to the threshold voltage fluctuation or variations.

SUMMARY OF THE INVENTION

It is therefore an object of the present invention to provide a circuit that compensates for a nonuniformity or variations of the threshold voltage.

To achieve the above objects and other advantages, there is provided a threshold voltage compensation circuit including a transistor having a threshold voltage, a first switching element for switching between a gate electrode and a drain terminal of the transistor, a first capacitor whose first electrode is connected to a contact between the gate electrode of the transistor and the first switching element so as to recognize and store the threshold voltage of the transistor, a second switching element for switching between a second electrode of the first capacitor and a source terminal of the transistor, and a third switching element for switching an input voltage to the second electrode of the first capacitor.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, which show preferred embodiments of the invention. This invention may, however, be embodied in many different forms and should not be construed as limited to the embodiments set forth herein.

Figure 3:
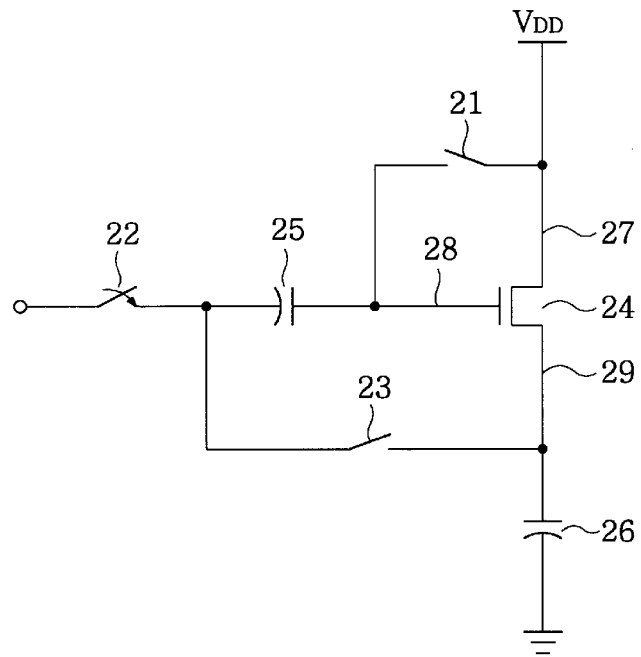
FIG. 3 illustrates a threshold voltage compensation circuit according to a first embodiment of the present invention.

Referring to FIG. 3, the threshold voltage compensation circuit according to a first embodiment of the present invention includes an NMOS transistor 24 consisting of a gate electrode 28, a source terminal 29, and a drain terminal 27 and having a certain threshold voltage, a first switching element 21 for switching between the gate electrode 28 of the NMOS transistor 24 and the drain terminal 27 of the NMOS transistor 24, a first capacitor 25 an anode of which is connected to a contact between the gate electrode 28 of the NMOS transistor 24 and the first switching element 21 so as to recognize and store the threshold voltage of the NMOS transistor 24, a second switching element 23 for switching between the cathode electrode of the first capacitor 25 and the source terminal 29 of the NMOS transistor 24, a second capacitor 26 connected between the source terminal 29 and the earth terminal so as to store the current of the source terminal 29, and a third switching element 22 for switching an input voltage to the cathode electrode of the first capacitor 25.

The threshold voltage compensation circuit according to the first embodiment of the present invention operates as follows.

First, if the first and second switching elements 21, 23 are turned on and the third switching element 22 is turned off, the drain terminal 27 and the gate electrode 28 of the NMOS transistor 24 form the same electric potential. At this time, the voltage higher than the threshold voltage is applied to the gate electrode and the source terminal 29 of the NMOS transistor 24, and the NMOS transistor 24 is turned on.

If the NMOS transistor 24 is turned on, the current flows between the drain terminal 27 and the source terminal 29 and the second capacitor 26 is charged, elevating the electric potential of the source terminal 29.

If the electric potential of the source terminal 29 reaches the difference between the electric potential of the gate electrode 28 and the threshold voltage, the NMOS transistor 24 is turned off, which stops the flow of the current. Here, the capacitor 25 recognizes and stores the threshold voltage of the NMOS transistor 24.

If the first and second switching elements 21, 23 are turned off and the third switching element 22 is closed, the input voltage is applied to the cathode electrode of the first capacitor 25. Since the first capacitor 25 has stored the threshold voltage of the NMOS transistor 24, the electric potential of the total of the input voltage and the threshold voltage of the NMOS transistor 24 appears to the gate electrode 28 of the NMOS transistor 24.

Then, the voltage higher than the threshold voltage is applied between the gate electrode 28 and the source terminal 29 of the NMOS transistor 24, which turns the NMOS transistor 24 on. Thus, the final electric potential of the source terminal 29 is the same as the value obtained by subtracting the threshold voltage from the electric potential of the gate electrode 28, i.e., the input voltage. Accordingly, the output voltage from the source terminal 29 becomes the input voltage regardless of the size of the threshold voltage.

That is, even when the threshold voltage of the NMOS transistor varies in accordance with the process condition, the input and output voltages become the same.

Figure 4:
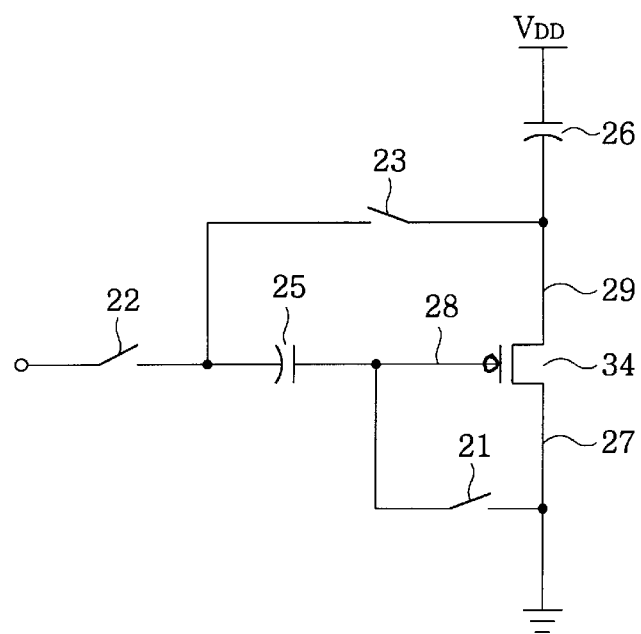
FIG. 4 illustrates a threshold voltage compensation circuit according to a second embodiment of the present invention.

Now referring to FIG. 4, the threshold voltage compensation circuit according to a second embodiment of the present invention includes a PMOS transistor 34 consisting of the gate electrode 28, the source terminal 29, and the drain terminal 27 and having a threshold voltage, the first switching element 21 for switching between the gate electrode 28 and the drain terminal 27 of the PMOS transistor 34, the first capacitor 25 an anode of which is connected to the contact between the gate electrode 28 of the PMOS transistor 34 and the first switching element 21 so as to recognize and store the threshold voltage of the PMOS transistor 34, the second switching element 23 for switching between the cathode electrode of the first capacitor 25 and the source terminal 29 of the PMOS transistor 24, the second capacitor 26 connected between the source terminal 29 of the PMOS transistor 34 and the constant voltage $V_{DD}$ so as to store the current of the source terminal 29, and the third switching element 22 for switching an input voltage to the cathode electrode of the first capacitor 25.

The threshold voltage compensation circuit of the second embodiment of the present invention operates similarly to the first embodiment.

Figure 5:
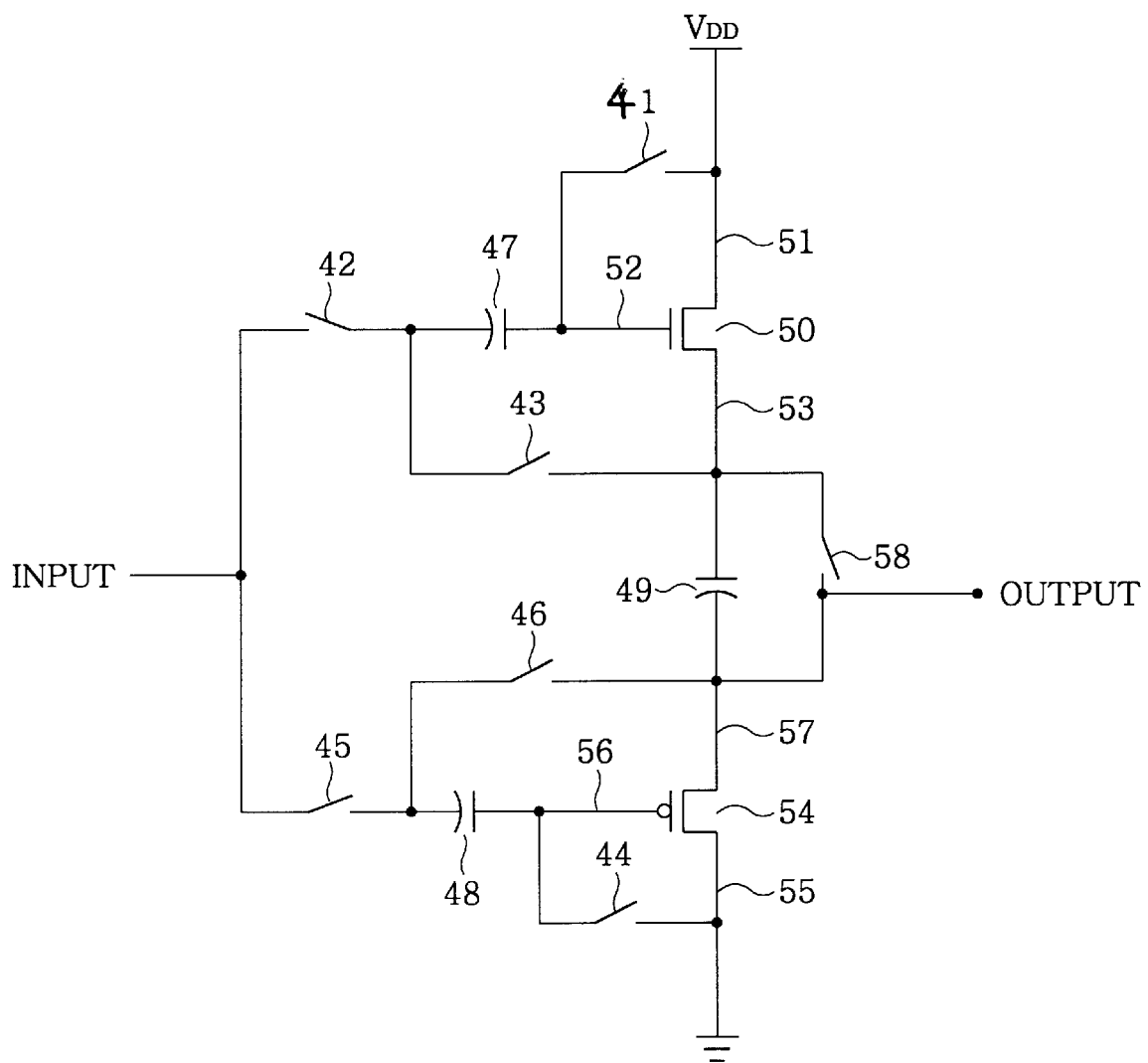
FIG. 5 illustrates a threshold voltage compensation circuit according to a third embodiment of the present invention.

Referring to FIG. 5, the threshold voltage compensation circuit of a third embodiment is constructed as if the circuits of the first and the second embodiments are connected in series.

That is, the threshold voltage compensation circuit of the third embodiment of the present invention includes an NMOS transistor 50 consisting of a gate electrode 52, a source terminal 53, and a drain terminal 51 and having a threshold voltage, a first switching element 41 for switching between the gate electrode 52 and the drain terminal 51 of the NMOS transistor 50, a first capacitor 47 an anode of which is connected to a contact between the gate electrode 52 of the NMOS transistor 50 and the first switching element 41 so as to recognize and store the threshold voltage of the NMOS transistor 50, a second switching element 43 for switching between the cathode electrode of the first capacitor 47 and the source terminal 53 of the NMOS transistor 50, a third switching element 42 for switching an input voltage to the cathode electrode of the first capacitor 47, a PMOS transistor 54 consisting of a gate electrode 56, a source terminal 57, and a drain terminal 55 and having a threshold voltage, a fourth switching element 44 for switching between the gate electrode 56 and the drain terminal 55 of the PMOS transistor 54, a second capacitor 48 an anode of which is connected to a contact between the gate electrode 56 of the PMOS transistor 54 and the fourth switching element 44 so as to recognize and store the threshold voltage of the PMOS transistor 54, a fifth switching element 46 for switching the cathode electrode of the second capacitor 48 and the source terminal 57 of the PMOS transistor 54, a third capacitor 49 connected between the source terminal 57 of the PMOS transistor 54 and the source terminal 53 of the NMOS transistor 50 so as to store the current of the source terminals 57 and 53 of the PMOS transistor 54 and the NMOS transistor 50, a sixth switching element 45 for switching an input voltage to the cathode electrode of the second capacitor 48, and a seventh switching element 58 for switching both terminals of the third capacitor 49 and utilizing them as an output terminal.

The threshold voltage compensation circuit of the third embodiment of the present invention operates as follows.

Initially, the first, second, fourth, fifth switching elements 41, 43, 44, 46 are turned on and the third, sixth, seventh switching elements 42, 45, 58 are turned off. The first capacitor 47 recognizes and stores the threshold voltage of the NMOS transistor 50 and the second capacitor 48 recognizes and stores the threshold voltage of the PMOS transistor 54.

If the first, second, fourth, fifth switching elements 41, 43, 44, 46 are turned off and the third, sixth, seventh switching elements 42, 45, 58 are turned on, the input voltage appears as an output voltage.

Here, if the input voltage is raised, the NMOS transistor 50 is turned on and the PMOS transistor 54 is turned off, which elevates the output voltage. On the contrary, if the input voltage is dropped down, the NMOS transistor 50 is turned off and the PMOS transistor 54 is turned on, which drops down the output voltage.

Thus, an analog amplifier without static current performing the elevation and drop-down of the output voltage regardless of the threshold voltage variations, can be obtained.

Figure 6:
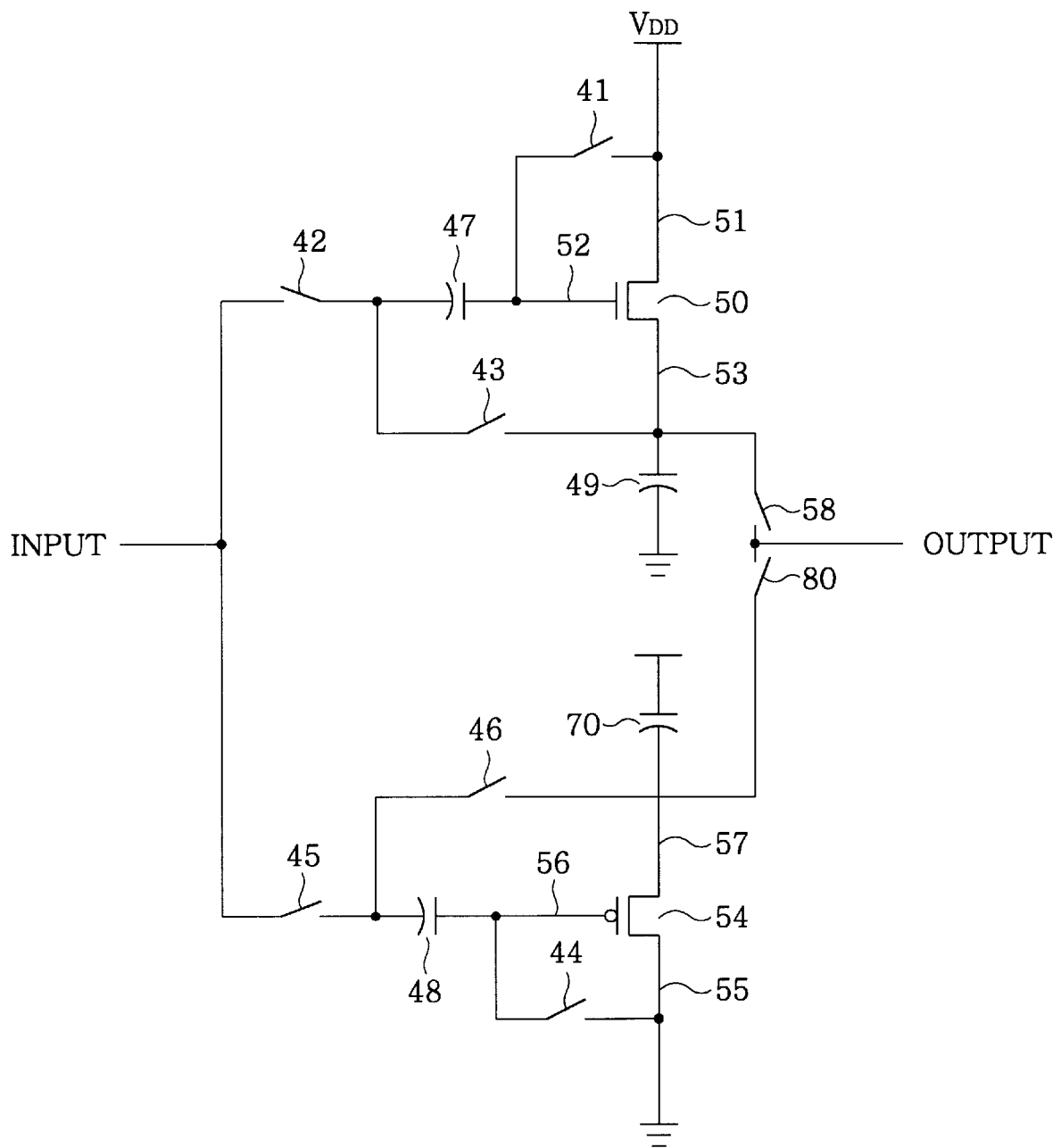
FIG. 6 illustrates a threshold voltage compensation circuit according to a fourth embodiment of the present invention.

The threshold voltage compensation circuit of a fourth embodiment of the present invention is shown in FIG. 6.

The circuit shown in FIG. 6 is constructed as if the circuit of the first embodiment and that of the second embodiment are connected in parallel.

That is, the threshold voltage compensation circuit of embodiment 4 of the present invention includes the NMOS transistor 50 which consists of the gate electrode 52, the source terminal 53, and the drain terminal 51 and has a threshold voltage, the first switching element 41 for switching between the gate electrode 52 and the drain terminal 51 of the NMOS transistor 50, the first capacitor 47 of which anode is connected to the contact between the gate electrode 52 of the NMOS transistor 50 and the first switching element 41 so as to recognize and store the threshold voltage of the NMOS transistor 50, the second switching element 43 for switching between the cathode electrode of the first capacitor 47 and the source terminal 53 of the NMOS transistor 50, the third switching element 42 for switching an input voltage to the cathode electrode of the first capacitor 47, the PMOS transistor 54 which consists of the gate electrode 56, the source terminal 57, and the drain terminal 55 and has a threshold voltage, the fourth switching element 44 for switching between the gate electrode 56 and the drain terminal 55 of the PMOS transistor 54, the second capacitor 48 of which anode is connected to the contact between the gate electrode 56 of the PMOS transistor 54 and the fourth switching element 44 so as to recognize and store the threshold voltage of the PMOS transistor 54, the fifth switching element 46 for switching between the cathode electrode of the second capacitor 48 and the source terminal 57 of the PMOS transistor 54, the third capacitor 49 connected between the source terminal 53 of the NMOS transistor 50 and the earth terminal so as to store the current of the source terminal 53 of the NMOS transistor 50, a fourth capacitor 70 connected between the source terminal 49 of the PMOS transistor 54 and the constant voltage so as to store the current of the source terminal 57 of the PMOS transistor 54, the sixth switching element 45 for switching an input voltage to the cathode electrode of the second capacitor 48, the seventh switching element 58 for switching between the source terminal 53 and the output terminal, and an eighth switching element 80 for switching between the source terminal 57 and the output terminal.

The circuit of the fourth embodiment of the present invention operates as follows.

The circuit of the fourth embodiment generates an output waveform by alternately operating the circuit same as those of the first and the second embodiments. The circuit of the fourth embodiment differs from those of the first and the second embodiments in that the seventh and eights switching elements 56, 80 are alternately turned on and off so as to deliver to the output terminal the output from the circuit same as those of the first and the second embodiments. The circuit of the fourth embodiment can be utilized when the input signal has a waveform which repeats a periodic rise and fall.

Figure 7:
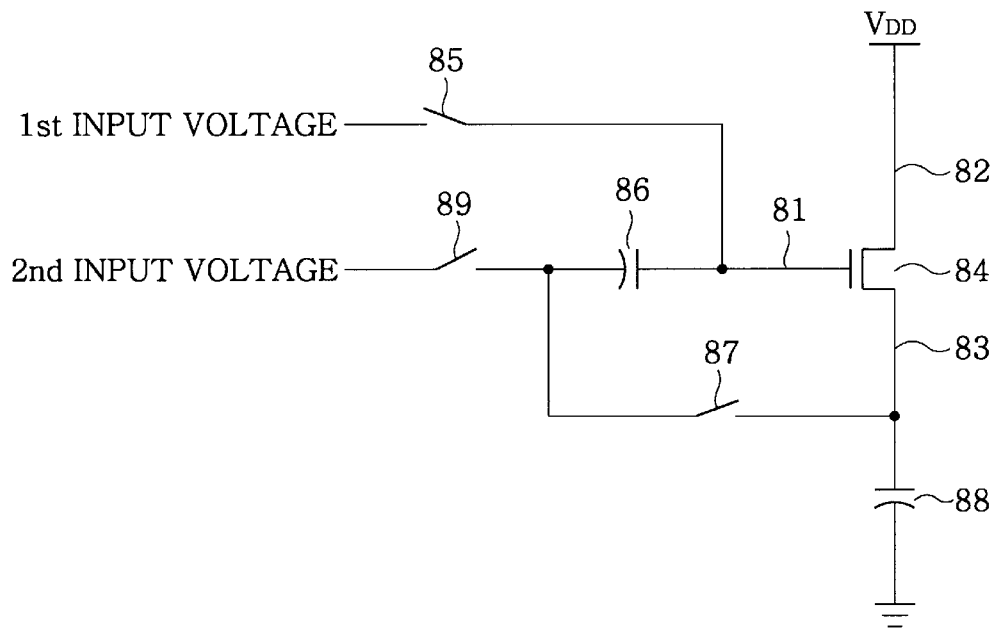
FIG. 7 illustrates a threshold voltage compensation circuit according to a fifth embodiment of the present invention.

The threshold voltage compensation circuit of the fifth embodiment of the present invention is shown in FIG. 7.

The circuit of the fifth embodiment of the present invention includes an NMOS transistor 84 which consists of a gate electrode 81, a source terminal 83, and a drain terminal 82 and has a threshold voltage, a first switching element 85 for switching the gate electrode 81 and a first voltage input terminal, a first capacitor 86 of which anode is connected to a contact between the gate electrode 81 and the first switching element 85 so as to recognize and store the threshold voltage of the NMOS transistor 84, a second switching element 87 for switching between the cathode electrode of the first capacitor 86 and the source terminal 83 of the NMOS transistor 84, a second capacitor 88 connected between the source terminal 83 of the NMOS transistor 84 and the earth terminal so as to store the current of the source terminal 83, and a third switching element 89 for switching a second input voltage to the cathode electrode of the first capacitor 86.

The threshold voltage compensation circuit of the fifth embodiment of the present invention operates similarly to those of the first embodiment.

Figure 8:
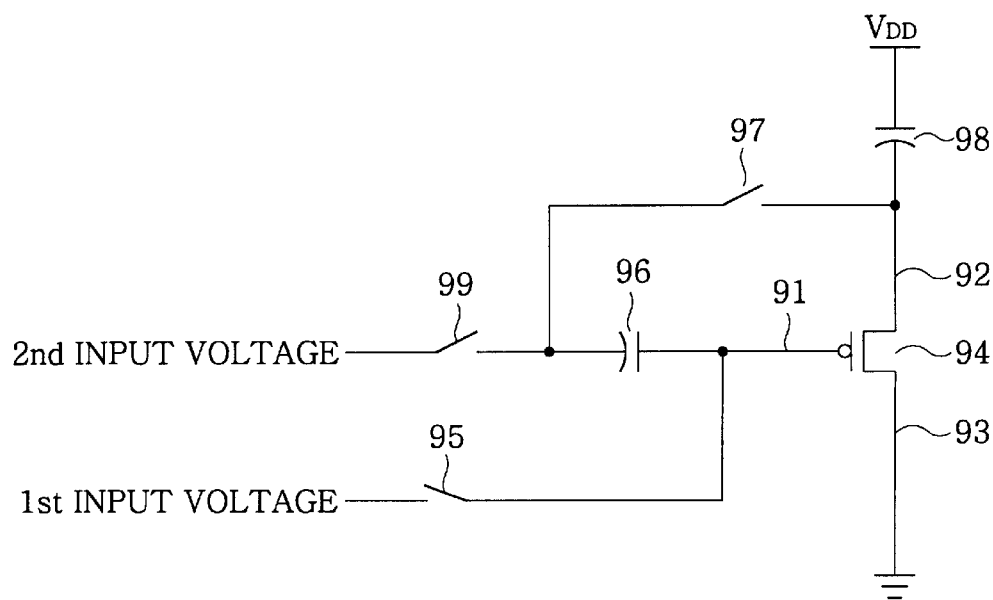
FIG. 8 illustrates a threshold voltage compensation circuit according to a sixth embodiment of the present invention.

In the meantime, the threshold voltage compensation circuit of a sixth embodiment is shown in FIG. 8.

The threshold voltage compensation circuit of the sixth embodiment includes a PMOS transistor 94 which consists of a gate electrode 91, a source terminal 92, and a drain terminal 93 and has a threshold voltage, a first switching element 95 for switching the gate electrode 91 and a first voltage input terminal, a first capacitor 96 of which anode is connected to a contact between the gate electrode 91 and the first switching element 95 so as to recognize and store the threshold voltage of the PMOS transistor 94, a second switching element 97 for switching between the cathode electrode of the first capacitor 96 and the source terminal 92 of the PMOS transistor 94, a second capacitor 98 connected between the source terminal 92 of the PMOS transistor 94 and the constant voltage $V_{DD}$ so as to store the current of the source terminal 92, and a third switching element 99 for switching a second input voltage to the cathode electrode of the first capacitor 96.

The threshold voltage compensation circuit of the sixth embodiment of the present invention operates similarly to those of the second embodiment.

Figure 9A:
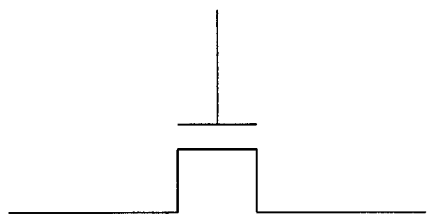
FIGS. 9A to 9C illustrate the structure of the switching element according to the present invention.
Figure 9B:
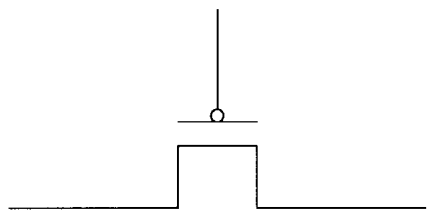
Figure 9C:
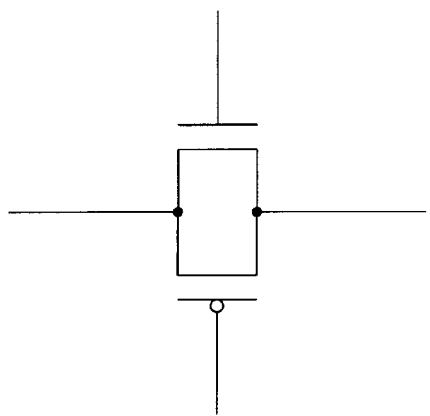

Each switching element in the circuits of the first, second, third, fourth, fifth and sixth embodiments can be made up of the NMOS transistor as shown in FIG. 9A, the PMOS transistor as shown in FIG. 9B, or the transmission gate as shown in FIG. 9C.

When such a threshold voltage compensation circuit is used, a distortion of an output may be caused to some extent when the threshold voltage varies, because there is a parasitic capacitance and each switching element is not perfect.

However, the most important reason for such a distortion is a charge injection caused by turning on and off of the switching element, and a coupling of the parasitic and the input capacitances between the gate sources.

The following Table 1 shows the distortion result when the threshold voltage varies from 2V to 7V. Here, the distortion decreases as the input capacitance increases.

TABLE 1

| input capacitance | output voltage variation | output voltage variation/threshold voltage variation (%) |
| --- | --- | --- |
| 20 pF | 0.5 V | 10% |
| 10 pF | 0.6 V | 12% |
| 5 pF | 0.63 V | 12.6% |
| 4 pF | 0.65 V | 13% |
| 3 pF | 0.7 V | 14% |
| 1 pF | 0.9 V | 18% |

The threshold voltage may vary according to the bias even among the devices having the same threshold voltage. This phenomenon appears when the output voltage intervals are reduced to some extent as compared with the input voltage intervals. As shown in Table 1, the degree of the distortion varies according to the input capacitance. This problem can be solved by increasing the scope of the input voltage by a predetermined ratio than the desired scope of the output.

The following Table 2 shows the degree of the distortion according to the input capacitance.

TABLE 2

| input capacitance | input/output size |
| --- | --- |
| 5 pF | 2.79/3 |
| 4 pF | 2.78/3 |
| 3 pF | 2.77/3 |
| 2 pF | 2.73/3 |
| 1 pF | 2.57/3 |

Figure 10A:
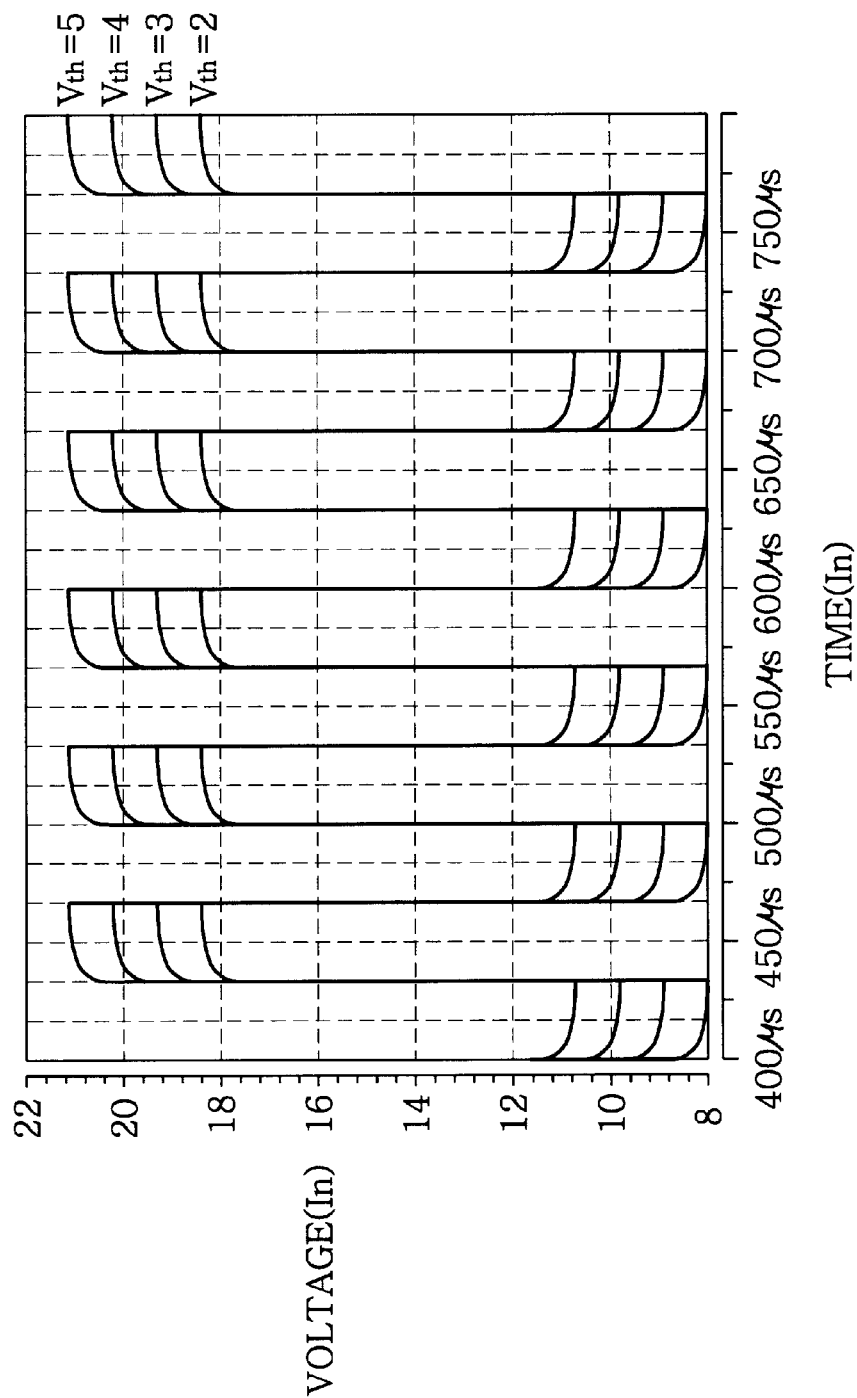
FIGS. 10A and 10B illustrate a comparison of output voltages between the conventional structure and the present invention.
Figure 10B:
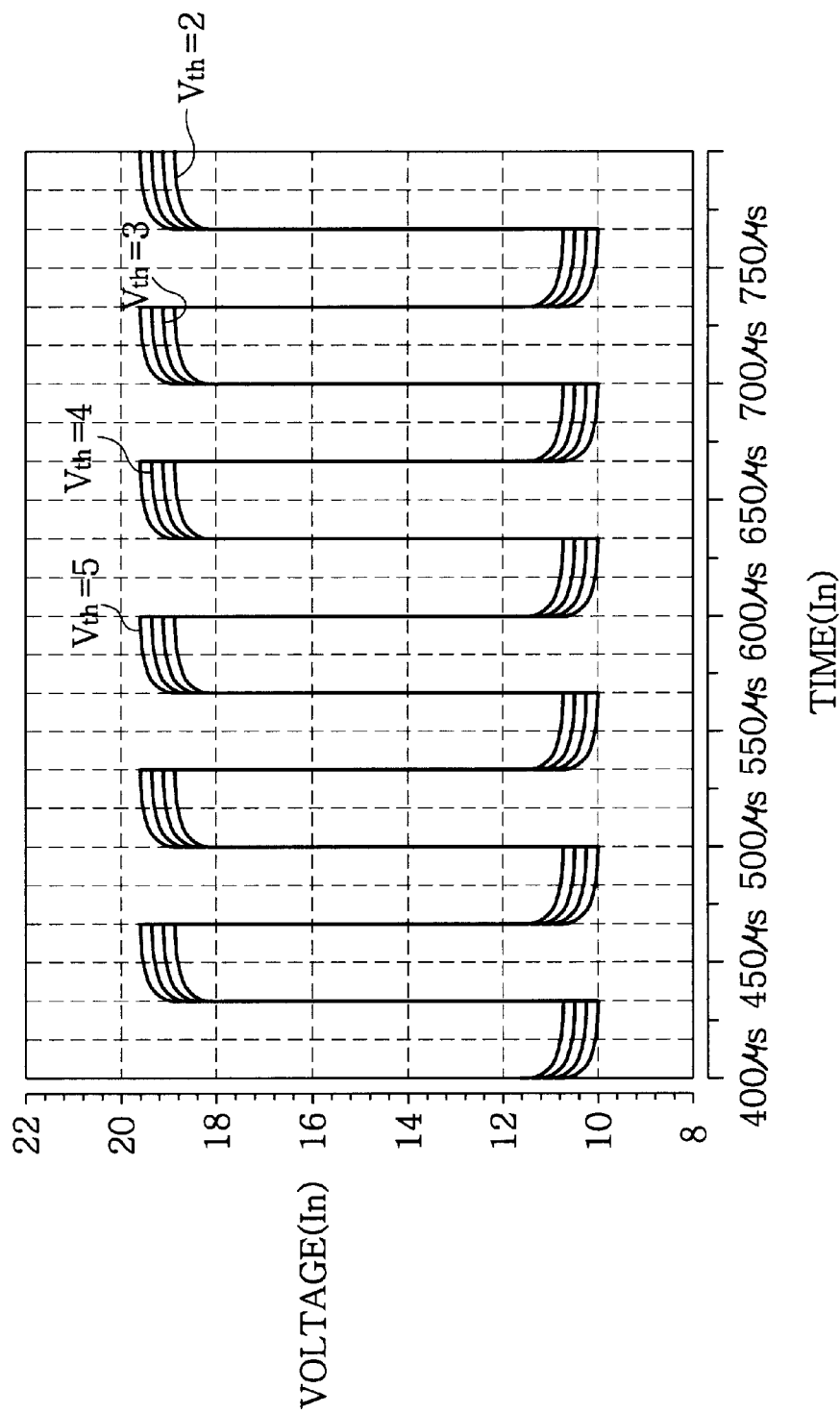

FIGS. 10A and 10B show the output waveform of the conventional structure and the present invention.

Figure 1:
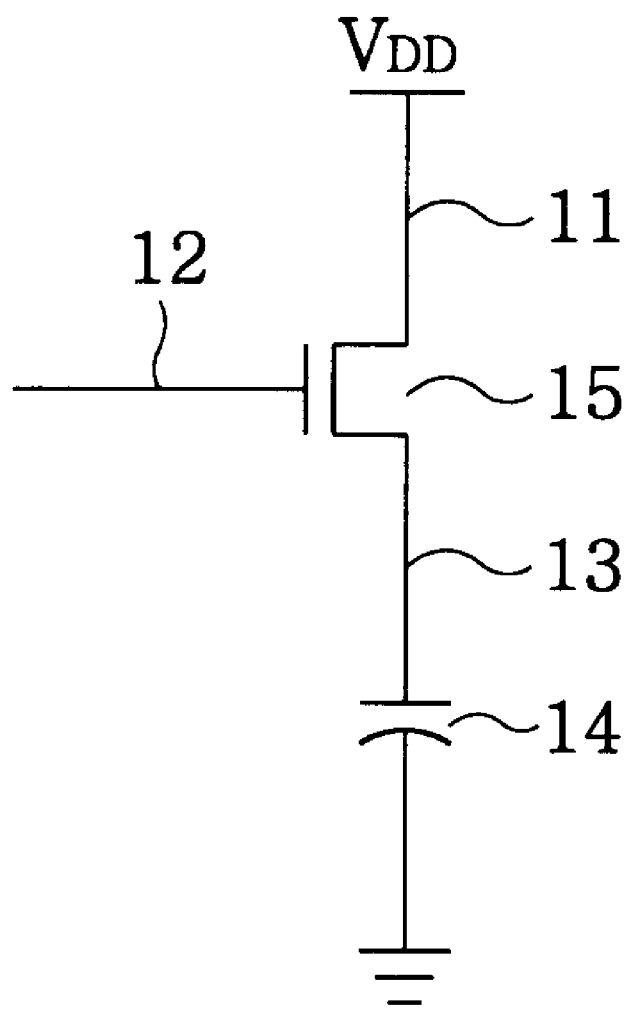
FIG. 1 illustrates a circuit of a conventional common drain MOS transistor.
Figure 2:
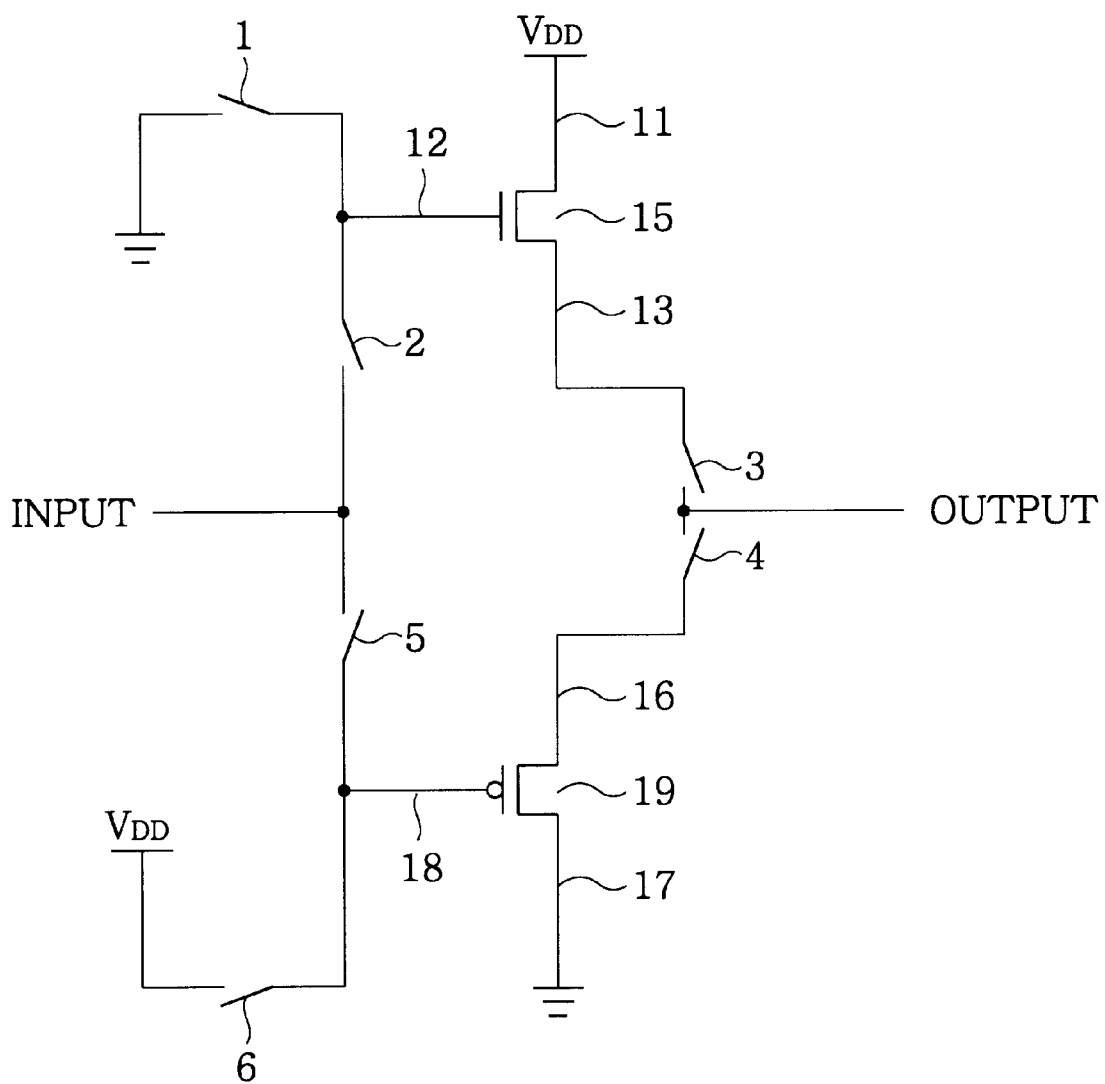
FIG. 2 illustrates a circuit of a conventional transistor consisting of NMOS and PMOS.

FIG. 10A shows the threshold voltage variation in the conventional transistor circuit structure shown in FIG. 2. FIG. 10B shows the threshold voltage variation in fourth embodiment of the present invention, decreased 10% or less than the conventional transistor circuit structure.

The threshold voltage compensation circuit of the present invention recognizes the threshold voltage of the transistor, stores it to a capacitor, and compensates for threshold voltage variations, to thereby eliminate the voltage drop-down caused by the threshold voltage variation.

This invention has been described above with reference to the aforementioned embodiments. It is evident, however, that many alternative modifications and variations will be apparent to those skilled in the art in light of the foregoing description.

Accordingly, the present invention embraces all such alternative modifications and variations falling within the spirit and scope of the appended claims.

What is claimed is:

1. A threshold voltage compensation circuit comprising:
    a transistor having a threshold voltage;
    a first switching element for switching a gate electrode and a drain terminal of said transistor;
    a first capacitor of which first electrode is connected to a contact between said gate electrode of said transistor and said first switching element so as to store said threshold voltage of said transistor;
    a second switching element for switching between a second electrode of said first capacitor and a source terminal of said transistor; and
    a third switching element for switching an input voltage to said second electrode of said first capacitor.

2. The threshold voltage compensation circuit according to claim 1, further comprising a second capacitor connected between said source terminal of said transistor and an earth terminal so as to store a current of said source terminal.

3. The threshold voltage compensation circuit according to claim 1, wherein said transistor is made up of an NMOS transistor.

4. The threshold voltage compensation circuit according to claim 1, wherein said transistor is made up of a PMOS transistor.

5. The threshold voltage compensation circuit according to claim 1, wherein each of said switching element is made up of an NMOS transistor.

6. The threshold voltage compensation circuit according to claim 1, wherein each of said switching element is made up of a PMOS transistor.

7. The threshold voltage compensation circuit according to claim 1, wherein each of said switching element is made up of a transmission gate.

8. A threshold voltage compensation circuit comprising:
    an NMOS transistor having a threshold voltage;
    a first switching element for switching between a gate electrode and a drain terminal of said NMOS transistor;
    a first capacitor of which first electrode is connected to a contact between said gate electrode of said NMOS transistor and said first switching element;
    a second switching element for switching between a second electrode of said first capacitor and a source terminal of said NMOS transistor;
    a third switching element for switching an input voltage to a cathode electrode of said first capacitor;
    a PMOS transistor having a threshold voltage;
    a fourth switching element for switching between a gate electrode and a drain terminal of said PMOS transistor;
    a second capacitor of which first electrode is connected to a contact between said gate electrode of said PMOS transistor and said fourth switching element;
    a fifth switching element for switching between a second electrode of said second capacitor and a source terminal of said PMOS transistor;
    a third capacitor connected between said source terminal of said PMOS transistor and said source terminal of said NMOS transistor;
    a sixth switching element for switching said input voltage to a cathode electrode of said second capacitor; and
    a seventh switching element for switching both terminals of said third capacitor so as to use as an output terminal.

9. A threshold voltage compensation circuit comprising:
    an NMOS transistor having a threshold voltage;
    a first switching element for switching between a gate electrode and a drain terminal of said NMOS transistor;
    a first capacitor of which first electrode is connected to a contact between said gate electrode of said NMOS transistor and said first switching element;

a second switching element for switching between a second electrode of said first capacitor and a source terminal of said NMOS transistor;

a third switching element for switching an input voltage to said second electrode of said first capacitor;

a PMOS transistor having a threshold voltage;

a fourth switching element for switching between a gate electrode and a drain terminal of said PMOS transistor;

a second capacitor of which first electrode is connected to a contact between said gate electrode of said PMOS transistor and said fourth switching element;

a fifth switching element for switching between a second electrode of said second capacitor and a source terminal of said PMOS transistor;

a third capacitor connected between said source terminal of said NMOS transistor and an earth terminal;

a fourth capacitor connected between said source terminal of said PMOS transistor and a terminal of a constant voltage;

a sixth switching element for switching said input voltage to said second electrode of said second capacitor;

a seventh switching element for switching between said source terminal and an output terminal of said NMOS transistor; and an eighth switching element for switching between said source terminal and an output terminal of said PMOS transistor.

10. A threshold voltage compensation circuit comprising:

a transistor having a threshold voltage;

a first switching element for switching between a gate electrode of said transistor and a first voltage input terminal;

a first capacitor of which first electrode is connected to a contact between said gate electrode of said transistor and said first switching element so as to recognize and store said threshold voltage of said transistor;

a second switching element for switching between a second electrode of said first capacitor and a source terminal of said transistor; and a third switching element for switching a second input voltage to said second electrode of said first capacitor.

11. The threshold voltage compensation circuit according to claim 10, wherein said transistor is an NMOS transistor.

12. The threshold voltage compensation circuit according to claim 11, wherein said transistor is a PMOS transistor.

* * * * *